(12) United States Patent
Olson et al.

(10) Patent No.: US 6,791,094 B1
(45) Date of Patent: Sep. 14, 2004

(54) METHOD AND APPARATUS FOR DETERMINING BEAM PARALLELISM AND DIRECTION

(75) Inventors: Joseph C. Olson, Beverly, MA (US); Donna L. Smatlak, Belmont, MA (US); Paul Daniel, Kittery Point, ME (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 09/588,419

(22) Filed: Jun. 6, 2000

Related U.S. Application Data

(60) Provisional application No. 60/140,878, filed on Jun. 24, 1999.

(51) Int. Cl.[7] .............................................. H01J 37/317
(52) U.S. Cl. .................... 250/397; 250/398; 250/396 R; 250/396 ML; 250/492.1; 250/492.2; 250/492.21
(58) Field of Search ........................... 250/492.1, 491.2, 250/492.22, 491.3, 397, 398, 492.21, 492.3, 505.1, 396 ML, 396 R

(56) References Cited

U.S. PATENT DOCUMENTS

| | | | | |
|---|---|---|---|---|
| 4,035,655 A | * | 7/1977 | Guernet et al. | 250/492.2 |
| 4,258,266 A | * | 3/1981 | Robinson et al. | 250/492.3 |
| 4,831,255 A | * | 5/1989 | Krivanek | 250/305 |
| 4,922,106 A | * | 5/1990 | Berrian et al. | 250/492.2 |
| 4,980,562 A | * | 12/1990 | Berrian et al. | 250/492.2 |
| 5,180,918 A | | 1/1993 | Isobe | |
| 5,624,536 A | * | 4/1997 | Wada et al. | 204/298.11 |
| 5,811,823 A | * | 9/1998 | Blake et al. | 250/492.21 |
| 5,898,179 A | * | 4/1999 | Smick et al. | 250/492.21 |
| 5,963,320 A | * | 10/1999 | Brooks et al. | 356/310 |
| 6,075,249 A | * | 6/2000 | Olson | 250/396 R |
| 6,163,033 A | | 12/2000 | Smick et al. | |
| 6,268,609 B1 | * | 7/2001 | Ryding et al. | 250/492.21 |
| 6,403,972 B1 | * | 6/2002 | Cucchetti et al. | 250/492.21 |
| 6,437,350 B1 | * | 8/2002 | Olson et al. | 250/492.21 |
| 6,437,351 B1 | * | 8/2002 | Smick et al. | 250/492.21 |
| 6,573,518 B1 | * | 6/2003 | Renau et al. | 250/492.21 |
| 2002/0134948 A1 | * | 9/2002 | Olson et al. | 250/492.21 |

* cited by examiner

*Primary Examiner*—John R. Lee
*Assistant Examiner*—David A. Vanore

(57) ABSTRACT

A method and apparatus for determining a direction or parallelism of a beam. The beam can be any type of beam, including uncharged or charged particle beams or electromagnetic radiation beams. The beam can have any desired size or shape and can be scanned or fixed in place. A direction or parallelism of the beam can be determined by adjusting an intensity profile of at least a portion of the beam at a first position. The adjusted intensity profile can be formed, for example, by blocking a portion of the beam at the first position. The adjusted intensity profile can be formed by a special purpose device, such as a mask, adjustable aperture, etc., or by another device having a separate purpose. For example, a beam modifier used to form the adjusted intensity profile can be a detector used to determine a measure of uniformity of the beam. One or more detected intensity profiles downstream of the first position can be identified and the relative positions of where the adjusted intensity profile is formed and where the intensity profile(s) are detected relative to a reference direction can be used to determine a direction or parallelism of the beam.

25 Claims, 6 Drawing Sheets

METHOD AND APPARATUS FOR DETERMINING BEAM PARALLELISM AND DIRECTION

CROSS REFERENCE TO RELATED APPLICATION

This application is related to and claims the benefit of the filing date of U.S. Provisional Application No. 60/140,878, filed Jun. 24, 1999. U.S. Provisional Application No. 60/140,878 is hereby incorporated by reference in its entirety.

FIELD OF THE INVENTION

This invention relates to determining a direction and/or a parallelism of a beam, e.g., a charged particle beam. In particular, the invention relates to adjusting an intensity profile of a portion of an ion beam and detecting the adjusted intensity profile to determine a parallelism and/or a direction of the ion beam.

BACKGROUND OF THE INVENTION

It may be important to know and control the direction and/or parallelism of a beam for the proper operation of various different types of devices and processes. As used herein, a parallelism of a beam is a measure of the extent to which the trajectories of different particles in the beam or different rays of the beam are parallel to a reference direction. Beam direction refers to the overall direction of the entire beam, not necessarily the direction of any particular particle or ray.

Ion implantation is a standard technique for introducing conductivity altering impurities into, or doping, semiconductor wafers. A typical ion implantation process uses an energetic ion beam to introduce impurities into the semiconductor wafers. As is well known, introducing the impurities at a uniform depth and dose into the wafers is important to ensure that the semiconductor devices being formed operate properly.

The depth at which impurities are implanted depends in part upon the angle of incidence of the ion beam pelative to the crystal structure of the semiconductor. Therefore, it is important to control the direction and/or parallelism of the ion beam during implantation to maintain a desired angle of incidence of the ions relative to a wafer's crystal structure, particularly when scanning the ion beam across a wafer surface. The direction of the ion beam is the overall orientation of the beam relative to the wafer or some other reference direction or surface. The parallelism of the beam is the relative degree of collimation of the beam, or a measure of convergence or divergence of two or more portions of a stationary or scanned beam.

When an ion beam is scanned across a wafer, the angle of incidence of the ions relative to the wafer can vary from one end of the scan to the other. Since both the direction and parallelism of the ion beam affect the direction that each ion impacts the wafer, knowing and controlling the direction and parallelism of the ion beam is useful in ensuring that the doped semiconductor wafer has desired characteristics. For example, if a scanned ion beam is known to have components at opposite ends of the scan line that are not sufficiently parallel to a desired direction, portions of the implantation system, such as an angle corrector magnet, can be adjusted to make the beam components more parallel to the desired direction. Even when a fixed ion beam is utilized and the wafer is mechanically scanned, measurement and control of beam parallelism and direction are needed to ensure that the ions in the ion beam are incident on the wafer at a desired angle of incidence over the area of the ion beam.

To date, no method for measuring the direction and/or parallelism of an ion beam in situ, i.e., while an ion implantation system is configured to implant a semiconductor wafer, are known. Instead, other methods, such as testing the characteristics of a doped semiconductor wafer, have been used to measure the direction and/or parallelism of an ion beam. These methods do not allow easy and rapid measurement and control of the ion beam direction or parallelism.

SUMMARY OF THE INVENTION

The invention provides a method and apparatus for determining a direction or parallelism of a beam. The beam can be a charged particle beam, such as an ion beam, a beam of electromagnetic radiation or other beam. In one aspect of the invention, an adjusted intensity profile is created at a first position from at least a portion of the beam. The adjusted intensity profile can be created at the first position, for example, by blocking or otherwise adjusting the intensity of a portion of the beam using a beam modifier, such as a mask or other intensity adjusting element. An intensity profile is detected downstream of the first position and can correspond closely to the adjusted intensity profile. For example, if the adjusted intensity profile is or includes a circular shadow portion, i.e., a circular portion of the beam is blocked, the detected intensity profile can be or include a circular shadow portion. Based on the position of the detected intensity profile relative to the position where the adjusted intensity profile is created, a measure of the beam's parallelism or direction can be determined. For example, if a circular portion of a beam is blocked at the position (0,0,5) where the position of the circular portion is measured in a (X,Y,Z) coordinate system, and a circular shadow is detected at the position (0,0,0), a determination can be made that the beam is parallel to the Z axis. In addition, if other portions of the beam have been determined to be parallel to the Z axis, or if other portions of the beam are assumed to be parallel to the Z axis, a determination can be made that the beam is a parallel or collimated beam.

In one aspect of the invention, a measure of the direction and/or parallelism of a beam can be made simultaneously with a determination of the uniformity of the beam. For example, a beam modifier that acts as a beam uniformity detector can be scanned across a beam, thus simultaneously providing an indication of uniformity of the beam while creating an adjusted intensity profile of a portion of the beam. An intensity profile of the beam can be detected downstream of the beam modifier and used similarly to the way discussed above to determine parallelism and/or direction of the beam. In another aspect of the invention, a determined direction or parallelism for the beam can be used to control generation of the beam so that the beam travels in a desired direction or parallelism.

The invention also provides an apparatus for determining a direction or parallelism of a beam. The apparatus may be a part of an ion implantation system and include a beam generator and a beam modifier that blocks at least a portion of an ion beam or otherwise alters an intensity profile of the ion beam. The beam modifier can be, or include, a detector, such as a detector used to determine a uniformity of the beam, or any other object that alters an intensity profile of at least a portion of the beam. The beam modifier can be fixed in place or moved to adjust the intensity profile of different portions of the beam. At least one detector downstream of the beam modifier can detect an intensity profile of at least a portion of the beam, and a controller can determine the direction of the beam and/or parallelism of the beam based on the relative positions of the beam modifier and the detector as well as the detected intensity profile. If the beam modifier is movable, the controller and optional drive mechanism can be used to control the movement of the beam modifier relative to the beam. Similarly, the controller and optional drive mechanism can move a detector relative to the beam. That is, the beam modifier can remain stationary and a detector can be moved relative to the beam and beam modifier to detect a beam intensity profile downstream of the beam modifier.

BRIEF DESCRIPTION OF THE DRAWINGS

The invention is described below in connection with the following drawings in which like reference numerals refer to like elements, and wherein.

DETAILED DESCRIPTION

Figure 1:
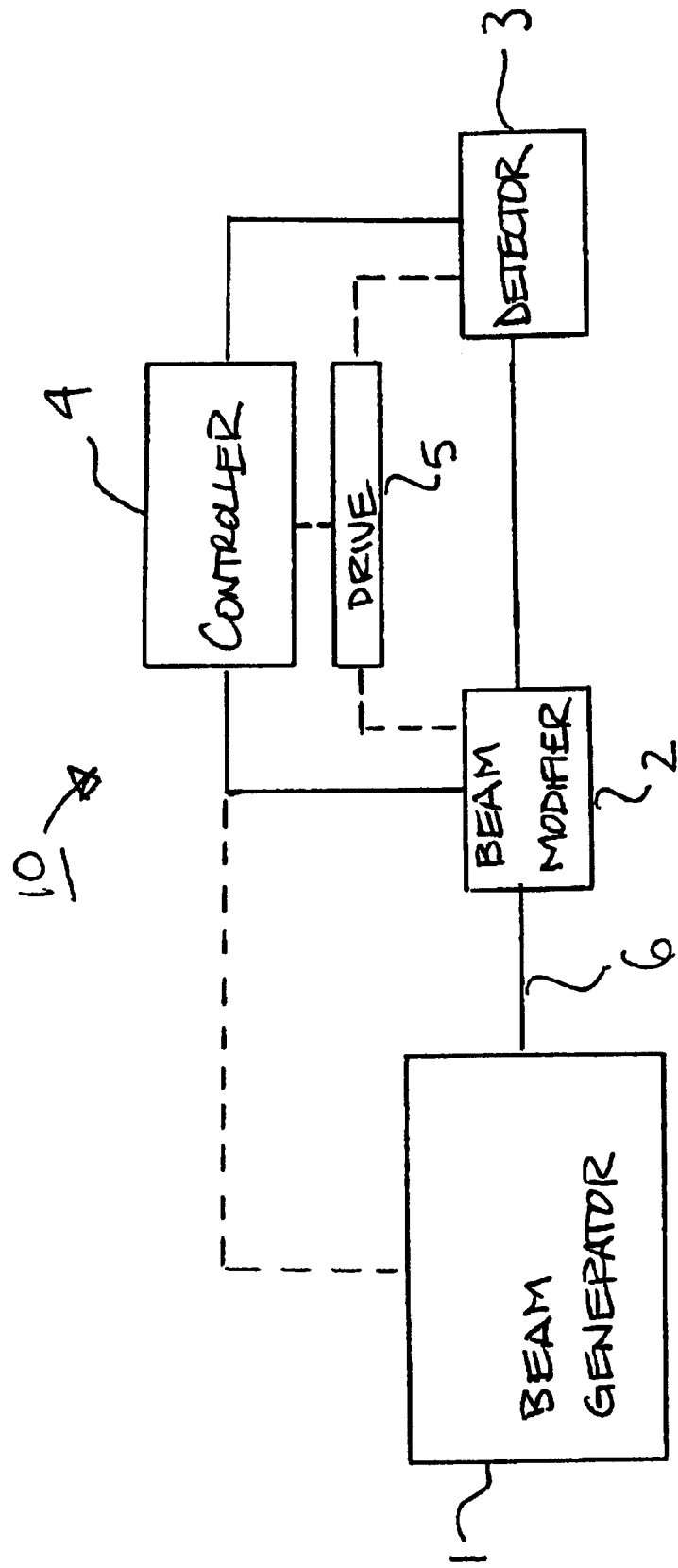
FIG. 1 is a schematic block diagram of a beam generator and beam analyzer in accordance with the invention.

FIG. 1 is a schematic block diagram of a beam generator 1 and a beam analyzer 10. The beam analyzer 10 in this example is capable of determining a direction and parallelism of a beam 6 generated by the beam generator 1, although the analyzer 10 may be arranged to determine only the direction or parallelism of the beam 6. In the description below, reference is made to determining the direction and/or parallelism of the beam 6. It should be understood that this reference does not require that the beam analyzer 10 determine the absolute direction or parallelism of the beam 6 by analysis of the entire beam 6. For example, the beam analyzer 10 could determine a direction and/or parallelism of the beam 6 based on an analysis of a single, relatively small portion of the beam 6 rather than based on an analysis of the entire beam 6.

The beam generator 1 can be any type of beam generator and generate any type of beam 6, such as an uncharged or charged particle beam used to implant semiconductor wafers, an electromagnetic radiation beam, etc. The beam 6 can be formed in various different ways, including by laser emission of a light beam, providing a charged particle source and accelerating the charged particles, by x-ray emission, etc. Further, the beam 6 need not have any specific size or shape. That is, the beam 6 can have any desired cross-section, can be collimated, convergent or divergent, can be scanned or formed by scanning a relatively smaller beam, etc.

The beam analyzer 10 includes a beam modifier 2 that adjusts an intensity profile of the beam 6, and a detector 3 downstream of the beam modifier 2 that detects an intensity profile of the beam 6. The beam modifier 2 can be or include one or more devices that alter an intensity profile of the beam 6. That is, the beam modifier 2 can be a mask or other object that blocks or otherwise attenuates portions of the beam 6 to create an adjusted intensity profile, or the beam modifier 2 can be a device that has a function in addition to creating an adjusted intensity profile. For example, the beam modifier 2 can be a detector, such as a Faraday detector in an ion implantation system that is used to determine a uniformity of the beam 6. The beam modifier 2 can be moved across a path of the beam 6 in such a way as to determine, or output a signal that can be used to determine, uniformity of the beam 6 or other beam 6 characteristics. Thus, the beam modifier 2 need not be a special purpose device that is used only to create an adjusted intensity profile. The beam modifier 2 can also include active elements to adjust an intensity profile of at least a portion of the beam 6. For example, the beam modifier 2 may include movable objects, such as mirrors, or other elements, such as liquid crystal cells, that can be selectively activated to adjust the intensity profile of a portion of the beam 6. For example, if the beam modifier 2 includes a transmissive liquid crystal device having a plurality of liquid crystal cells, individual cells in the device may be activated to adjust an intensity profile of the beam 6 transmitted through the device. In short, the beam modifier 2 can be any device that adjusts, e.g., attenuates, amplifies, focuses, distorts, diverts, etc., any portion of the beam 6 to create an adjusted intensity profile. In its simplest form, the beam modifier 2 is an element that blocks a portion of the beam 6.

The detector 3 can be any type of beam detector, depending upon the nature of the beam 6. For example, the detector 3 can be a CCD imager or other light sensitive device, a Faraday detector used for detecting the presence of charged particles, or other particle or electromagnetic radiation detector. The detector 3 can include one or more detection devices (e.g., can include a single large area detector or one or more smaller area detectors) and can be fixed in place or movable in one or more directions transverse to the overall direction of the beam 6.

The beam analyzer 10 can also include a controller 4 that communicates with the beam modifier 2 and/or the detector 3. Although the controller 4 is shown in FIG. 1 as communicating with both the beam modifier 2 and the detector 3, communication with the beam modifier 2 is optional in this example. The controller 4 can receive detected intensity profile information from the detector 3, as well as position information from the detector 3 and the beam modifier 2, to determine the direction of the beam 6 and/or a parallelism of the beam 6, as discussed in more detail below. The controller 4 can be a programmed general purpose computer, or network of programmed general purpose computers, along with other circuitry and devices required to perform the desired input/output or other functions. The controller 4 can also include other devices, such as a monitor, printer or other display device, a keyboard, user pointing device, touch screen or other user interface, storage devices, communication devices, or other electronic circuitry or components. The controller 4 can also be or include other programmed or hard-wired electronic devices, such as application-specific integrated circuits (e.g., ASICs), discrete element circuits, FPGAs, etc.

The beam analyzer 10 can also include a drive system 5 for physically moving the beam modifier 2 and/or the detector 3. That is, the beam modifier 2 and/or the detector 3 can be moved transverse to the beam 6 to enable determining the direction of the beam 6 or the beam's parallelism at different points in the beam 6. Although the beam modifier 2 and the detector 3 can be moved, it is also possible to have either or both of the beam modifier 2 or the detector 3 fixed in place. For example, the beam modifier 2 may include a single fixed mask and the detector 3 may include several fixed, individual detectors downstream of the mask. The direction and/or parallelism of the beam may be determined based on which fixed detector detects the adjusted intensity profile formed by the mask. The drive system 5 can also include position encoders or other position determining devices to provide position information regarding a relative location of the beam modifier 2 or the detector 3. Furthermore, the relative position of the beam modifier 2 or the detector 3 can be determined in other ways. The drive system 5 can also include any other desired components, such as a power supply, drive motors, mechanical linkages, hydraulic or pneumatic actuators, etc. to move the beam modifier 2 and/or detector 3, as is well known in the art.

Figure 2:
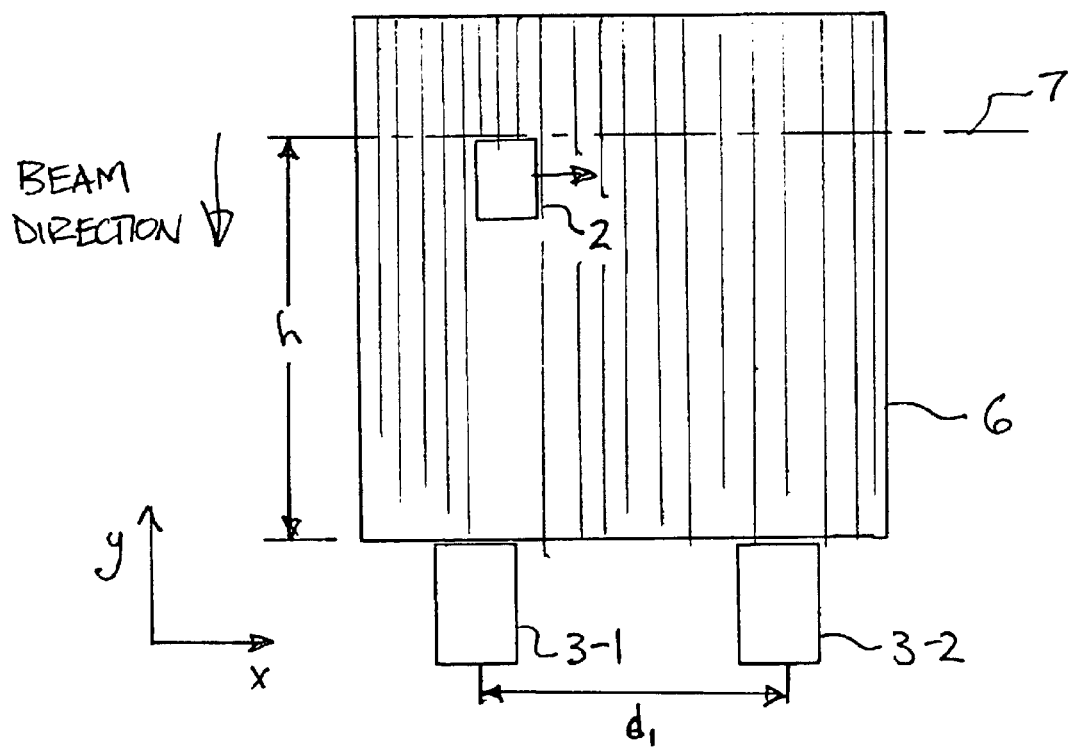
FIG. 2 is a schematic diagram showing a beam modifier creating an adjusted intensity profile of a beam and detectors to detect an intensity profile.

In operation, the beam modifier 2 is positioned in the path of the beam 6 to create an adjusted intensity profile of the beam. As discussed above, the beam modifier 2 can have any size or shape and can be fixed in place or movable to create the adjusted intensity profile. One examplary arrangement is shown in FIG. 2, in which a beam modifier 2 having a cylindrical shape is scanned across the beam 6 along a workpiece plane 7. The workpiece plane 7 in this example is a theoretical plane where the beam 6 is intended to be incident on a workpiece. For example, if the beam 6 is an ion beam, the ion beam 6 may be incident on a semiconductor wafer positioned at the workpiece plane 7. However, it should be understood that the beam modifier 2 need not travel along a workpiece plane 7, but rather the beam modifier 2 as well as the detector 3 may be positioned at any point along the beam 6 either upstream or downstream of a workpiece plane 7. The beam 6 is shown in FIG. 2 as having parallel trajectories or rays and as having a direction normal to the workpiece plane 7.

In this example, as the beam modifier 2 moves in a direction transverse to the beam 6, a portion of the beam 6 is blocked by the beam modifier 2. Thus, a "shadow" of the beam modifier 2 is formed downstream of the beam modifier 2 on one or more detectors 3. In this example, two fixed detectors 3 are used to detect an intensity profile of the beam 6.

Figure 3:
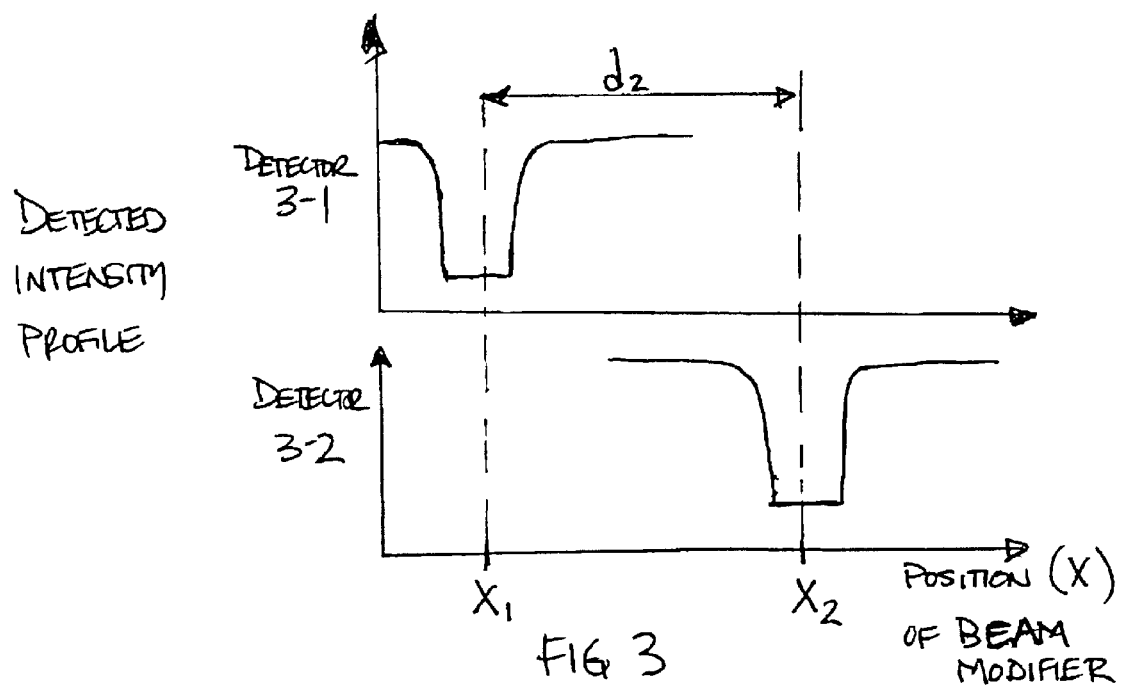
FIG. 3 shows a pair of a detected intensity profiles provided by the detectors shown in FIG. 2.

FIG. 3 shows one example of a set of detected intensity profiles resulting from the arrangement shown in FIG. 2. The detected intensity profiles shown in FIG. 3 indicate the beam intensity detected by the detectors 3-1 and 3-2 as a function of the beam modifier 2 position along the X axis. That is, the detected intensity levels for each profile are shown as a function of the position of the beam modifier 2. Correlation of the detected beam intensity with the position of the beam modifier 2 can be performed by the controller 4 as the beam modifier 2 is scanned across the beam 6. For example, the controller 4 may periodically correlate and store each detected beam intensity level for each detector 3 with the corresponding beam modifier 2 position as the beam modifier 2 is scanned.

The minimum levels of the detected intensity profiles shown in FIG. 3 represent a condition where the beam modifier 2 shadows the detectors 3. In this example, the minimum detected intensity portions have a flat line segment because the beam modifier 2 is slightly larger in the X direction than the detection area of the detectors 3. However, the beam modifier 2 need not be larger than detectors 3 and instead may block a portion of the beam 6 that is the same size or smaller than the detection area of the detectors 3.

The detected intensity profile information in FIG. 3 can be used in various different ways to determine a direction and/or parallelism of the beam 6. Once the minimum intensity levels for each of the intensity profiles are identified (using well known techniques), the corresponding beam modifier 2 position values $X_1$ and $X_2$ can be identified and compared to the known X axis positions $X_{3-1}$ and $X_{3-2}$ of the center points of the detectors 3-1 and 3-2, respectively. For example, if the distance $d_1$ (the distance between the center points of the detectors 3-1 and 3-2, i.e., $X_{3-2}-X_{3-1}$) is the same as the distance $d_2$ (the distance between beam modifier 2 positions that correspond to center points of the detected minimum intensity for each of the detectors 3, i.e., $X_2-X_1$), a determination can be made that the beam 6 has a high degree of parallelism. The detected intensity profile information can be used in other ways. For example, if the position $X_1$ of the beam modifier 2 (which is the position of the beam modifier 2 where a minimum detected intensity was present at the detector 3-1) is not equal to the position $X_{3-1}$ of the center point of the detector 3-1, a determination can be made that the beam 6, or a portion of the beam 6, is not parallel to the Y axis. Since the perpendicular distance h between the detectors 3 and the beam modifier 2 is known, an angle of the beam 6 portion direction with respect to the Y axis can be calculated. A similar calculation can be made regarding the minimum detected intensity by the detector 3-2. The calculated angles can be used to determine a direction of the beam 6 or a parallelism of the beam 6.

FIGS. 4–11 are used to further illustrate how to determine a direction and/or parallelism of the beam 6 for four different beam 6 conditions using the beam modifier 2 and detector 3 arrangement of FIG. 2.

Figure 4:
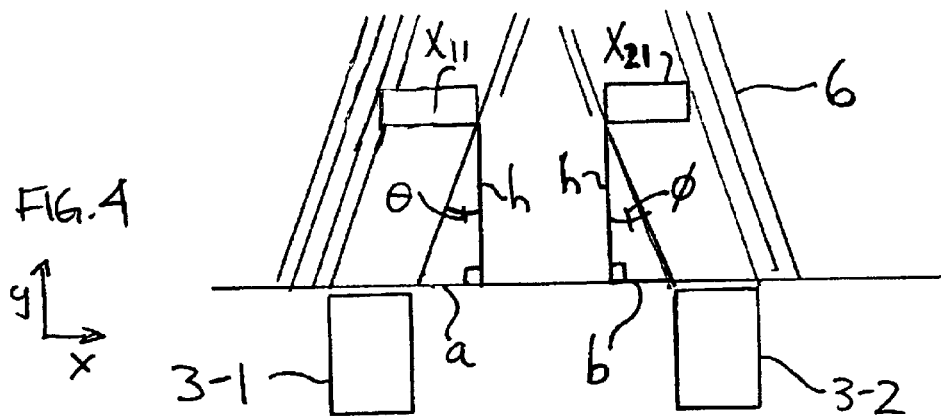
FIG. 4 shows an example of a diverging beam.
Figure 8:
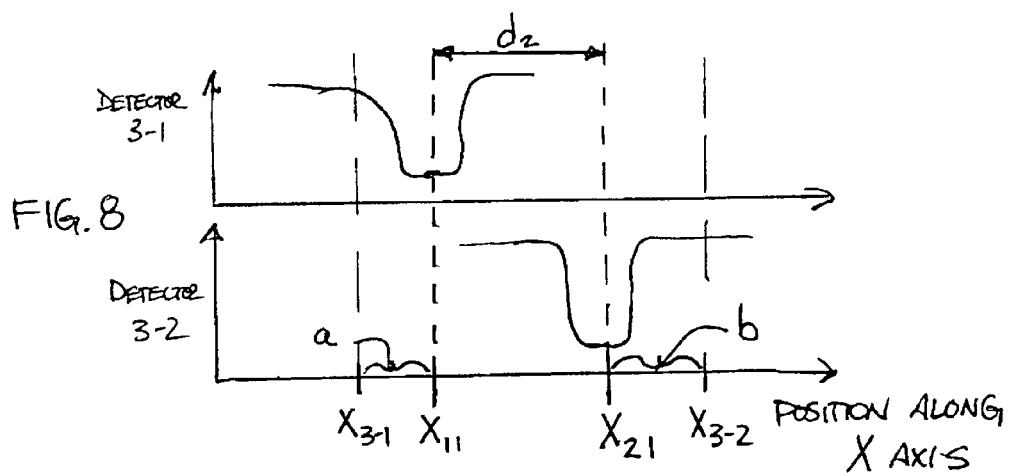
FIG. 8 shows exemplary detected intensity profiles for the FIG. 4 arrangement.

FIG. 4 shows an example of a diverging beam 6. In this example, the beam modifier 2 is shown in two beam modifier positions $X_{11}$ and $X_{21}$ in which each of the detectors 3-1 and 3-2 detect a minimum beam intensity, respectively. FIG. 8 shows intensity profiles detected by the detectors 3-1 and 3-2 for the arrangement in FIG. 4. As can be seen in FIG. 8, the low intensity point detected by the detector 3-1 occurs at $X_{11}$ when the beam modifier 2 is at the position $X_{11}$, and the low intensity point detected by the detector 3-2 occurs at $X_{21}$ when the beam modifier 2 is at the position $X_{21}$. The position $X_{11}$ is at a distance a to the right of the detector 3-1 position $X_{3-1}$, and the position $X_{21}$ is at a distance b to the left of the detector 3-2 position $X_{3-2}$. a is equal to $X_{11}-X_{3-1}$, and b is equal to $X_{3-2}-X_{21}$. Thus, the distance d2, which is the distance between $X_{11}$ and $X_{21}$, is less than the distance d1, which is the distance between the detectors 3-1 and 3-2, indicating that the beam 6 is a diverging beam. Since the detectors 3-1 and 3-2 are positioned at a distance h along the Y axis away from the beam modifier 2, the inclination angle θ of the beam 6 portion near the beam modifier position $X_{11}$ can be determined according to Equation 1.

$$\text{TAN}\theta = \frac{a}{h} \quad (1)$$

Similarly, the angle of inclination φ of the beam 6 portion near the beam modifier position $X_{21}$ can be determined according to Equation 2.

$$\text{TAN}\phi = \frac{b}{h} \quad (2)$$

Thus, the angles θ and φ can provide a measure of the degree of parallelism of the beam 6, e.g., the beam 6 can be determined to be diverging at an angle of the sum of the absolute values of θ and φ. It should be understood that the either the angle θ or the angle φ can be used alone to determine the parallelism of the beam 6, e.g., if it is assumed that the beam diverges symmetrically and that the beam axis is parallel to the Y axis. Thus, only the angle θ need be determined to provide a parallelism of the beam 6. A measure of the beam 6 direction may be determined by determining the difference between θ and φ. The difference between θ and φ can provide an overall direction of the beam 6 relative to the Y axis, for example, as shown in Equation 3:

$$\psi = (\theta + \phi)/2 \quad (3)$$

where ψ is an angle of the overall direction of the beam 6 with respect to the Y axis. In this example, angles are measured as positive in a clockwise direction from the Y axis, and negative in a counterclockwise direction from the Y axis. Thus, in FIG. 4, θ could be equal to +60 degrees, φ could be −30 degrees, and ψ is equal to +15 degrees according to Equation 3.

Although Equation 3 determines the overall direction of the beam 6 as a direction of a line that bisects the angle between two measured portions of the beam 6, the direction of the beam 6 may be determined in other ways. For example, the direction of the beam 6 shown in FIG. 4 may be determined as a direction of a line that originates from a point of intersection of the beam portions that illuminate the beam modifier 2 at the two bean modifier positions $X_{11}$ and $X_{21}$ (e.g., a point of intersection of the beam portions upstream of the beam modifier 2), and bisects a line extending between the centerpoints of the detectors 3-1 and 3-2. An angle ψ of this line with respect to the Y axis may be defined in accordance with Equation 4.

$$\psi = \text{TAN}^{-1}(\text{TAN}\theta + \text{TAN}\phi)/2) \quad (4)$$

Figure 5:
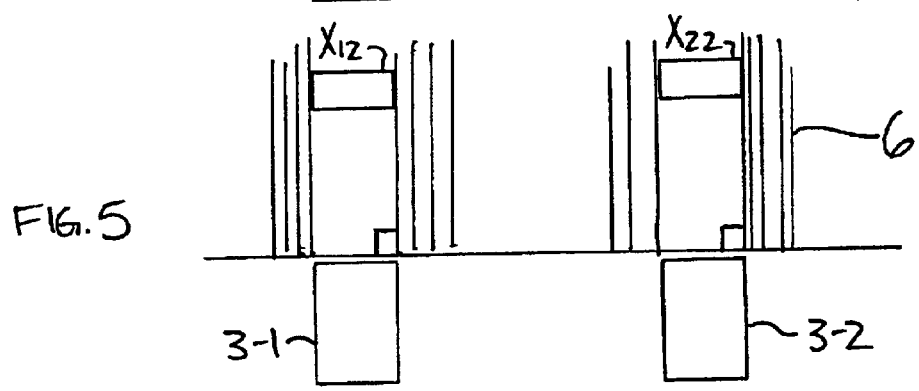
FIG. 5 shows an example of a collimated beam that is perpendicular to a workpiece plane.
Figure 9:
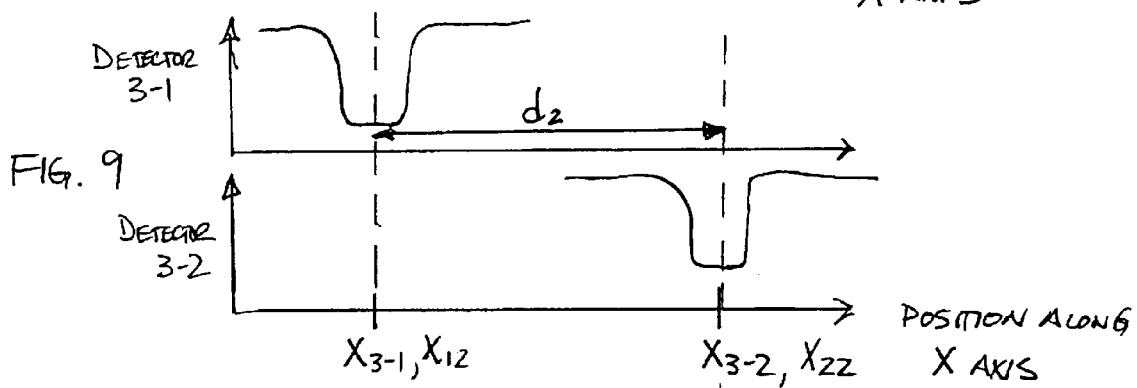
FIG. 9 shows exemplary detected intensity profiles for the FIG. 5 arrangement.

FIG. 5 shows an example of a collimated beam that is incident on the detectors 3-1 and 3-2 in a direction parallel to the Y axis, and FIG. 9 shows the detected intensity profiles for the detectors 3-1 and 3-2 for the FIG. 5 arrangement. In this example, the positions $X_{12}$ and $X_{22}$ of the beam modifier 2 that correspond to the minimum intensity portions detected by the detectors 3-1 and 3-2 are at a same position along the X axis as the detectors 3-1 and 3-2, i.e., are coincident with positions $X_{3-1}$ and $X_{3-2}$. As a result, the distance d2 (the distance between $X_{12}$ and $X_{22}$) is the same as the distance d1 (the distance between $X_{3-1}$ and $X_{3-2}$). Since the positions $X_{12}$ and $X_{22}$ are coincident with positions $X_{3-1}$ and $X_{3-2}$, and the distance d1 is the same as d2, a determination can be made that the beam 6 is directed parallel to the Y axis and is a collimated beam.

Figure 6:
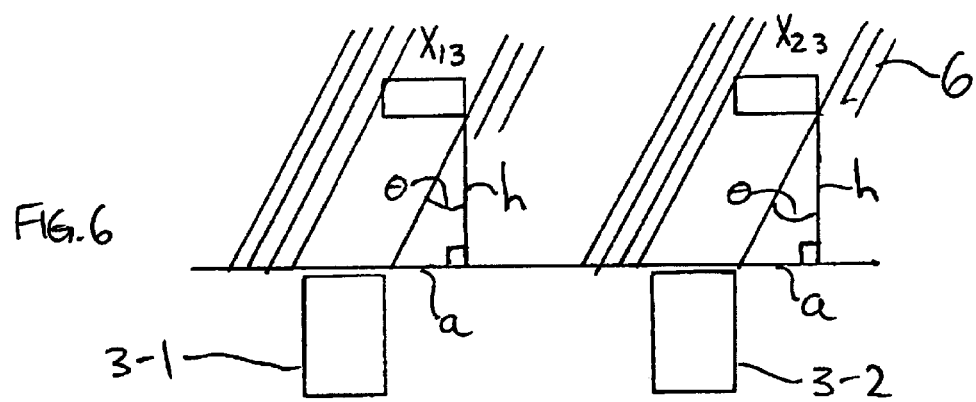
FIG. 6 shows an example of a collimated beam oriented at an angle to a workpiece plane.
Figure 10:
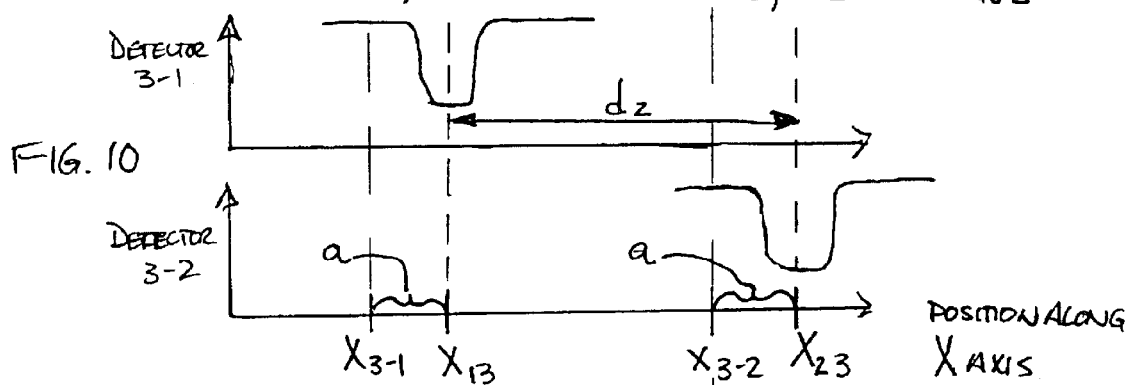
FIG. 10 shows exemplary detected intensity profiles for the FIG. 6 arrangement.

FIG. 6 shows a collimated beam 6 that is oriented at an angle θ with respect to the Y axis, and FIG. 10 shows the detected intensity profiles for the detectors 3-1 and 3-2 for the FIG. 6 arrangement. The beam modifier 2 positions $X_{13}$ and $X_{23}$ that correspond to the detected minimum intensity portions are located at a distance a to the right of the positions $X_{3-1}$ and $X_{3-2}$ of the detectors 3-1 and 3-2, respectively. Thus, beam 6 portions near the beam modifier 2 positions $X_{13}$ and $X_{23}$ can be determined to be oriented at an angle θ with respect to the Y axis in accordance with Equation 1. Since both beam 6 portions near the beam modifier 2 positions $X_{13}$ and $X_{23}$ are inclined at a same angle θ, a determination can be made using Equation 3, for example, that the beam 6 is a collimated beam and that the beam 6 is oriented at an angle ψ=(θ+θ)2=θ with respect to the Y axis. As with the other examples above, only one adjusted intensity profile need be created and a corresponding intensity profile detected to determine a direction of the beam 6 and/or the beam's parallelism. For example, an assumption can be made that the beam 6 is a collimated beam and that a determination of the angle of the beam 6 portion near the beam modifier 2 position $X_{13}$ represents a direction of the beam 6. Thus, only the intensity profile detected by the detector 3-1 need be detected and used to determine that the beam 6 portion near the beam modifier position $X_{13}$ is oriented at an angle θ with respect to the Y axis.

Figure 7:
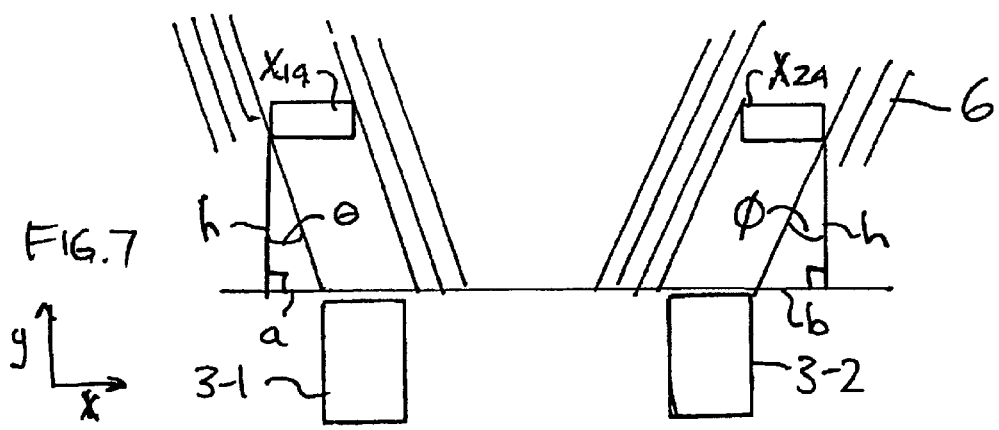
FIG. 7 shows an example of a converging beam.
Figure 11:
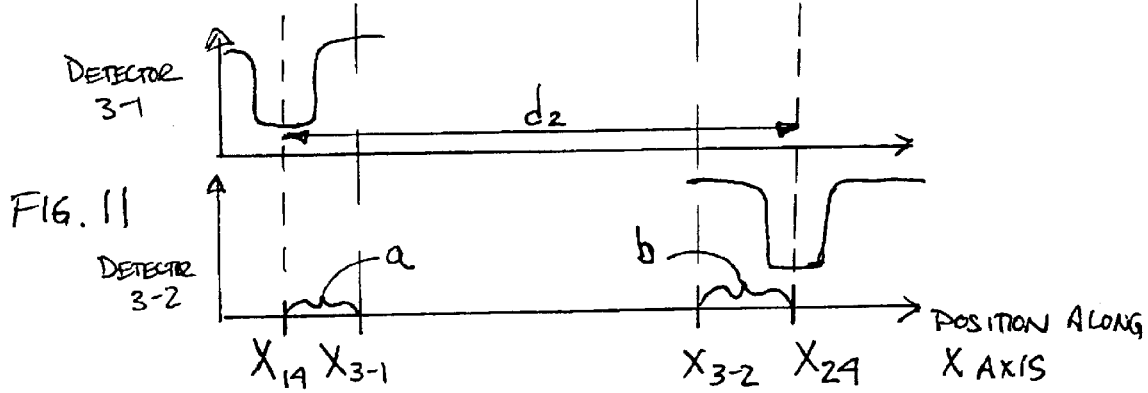
FIG. 11 shows exemplary detected intensity profiles for the FIG. 7 arrangement.

FIG. 7 shows an example of a converging beam 6, and FIG. 11 shows intensity profiles detected by the detectors 3-1 and 3-2 for the FIG. 7 arrangement As can be seen in FIG. 11, the minimum intensity point detected by the detector 3-1 occurs when the beam modifier 2 is at the position $X_{14}$, and the minimum intensity point detected by the detector 3-2 occurs when the beam modifier 2 is at the position $X_{24}$. The position $X_{14}$ is at a distance a to the left of the detector 3-1 position $X_{3-1}$, and the position $X_{24}$ is at a distance b to the right of the detector 3-2 position $X_{3-2}$. Thus, the distance d2, which is the distance between $X_{14}$ and $X_{24}$, is greater than the distance d1, which is the distance between the detectors 3-1 and 3-2, indicating that the beam 6 is a converging beam. Since the detectors 3-1 and 3-2 are positioned at a distance h along the Y axis away from the beam modifier 2, the inclination angle θ of the beam 6 portion near the beam modifier position $X_{14}$ can be determined according to Equation 1, and the angle of inclination φ of the beam 6 portion near the beam modifier position $X_{24}$ can be determined according to Equation 2.

The angles θ and φ can provide a measure of the degree of parallelism of the beam 6, e.g., the beam 6 can be determined to be converging at an angle of the sum of the absolute values of θ and φ. It should be understood that either the angle θ or the angle φ can be used alone to determine a parallelism of the beam 6. For example, an assumption may be made that the beam 6 converges at an angle equal to 2θ. Thus, only the angle θ need be determined to provide a parallelism of the beam 6.

The examples shown above only involve determining a direction and/or a parallelism of a beam 6 in two dimensions. It should be understood that a direction of a beam 6 and a parallelism of a beam 6 can be determined in three dimensions, if desired, by applying the same principles described above in three dimensions. In addition, the is examples shown above involve forming an adjusted intensity profile such that a portion of the beam 6 is entirely blocked. However, other adjusted intensity profiles can be formed. For example, a beam modifier 2 may attenuate a portion of the beam 6 so that a part of the beam 6 passes through the beam modifier 2. For example, it may be desirable to allow a part of the beam to pass through the beam modifier 2 so that information contained in this portion of the beam 6 can be used for determining the beam uniformity or other purposes. In the case of a light beam, the beam modifier 2 may be an optical filter that blocks selected wavelengths in a beam 6, but allows other wavelengths to pass. Similarly, the intensity profile detected in the examples shown above are low intensity profiles. However, the detected intensity profiles can be other types of profiles, such as high intensity profiles or different intensity patterns. For example, a beam modifier 2 may include a mask that blocks all or most of a beam 6, but has a hole formed in the mask so that a high intensity spot is formed on a detector 3. In this example, a detected intensity profile includes a high intensity portion that is used to determine the direction or parallelism of the beam 6.

Figure 12:
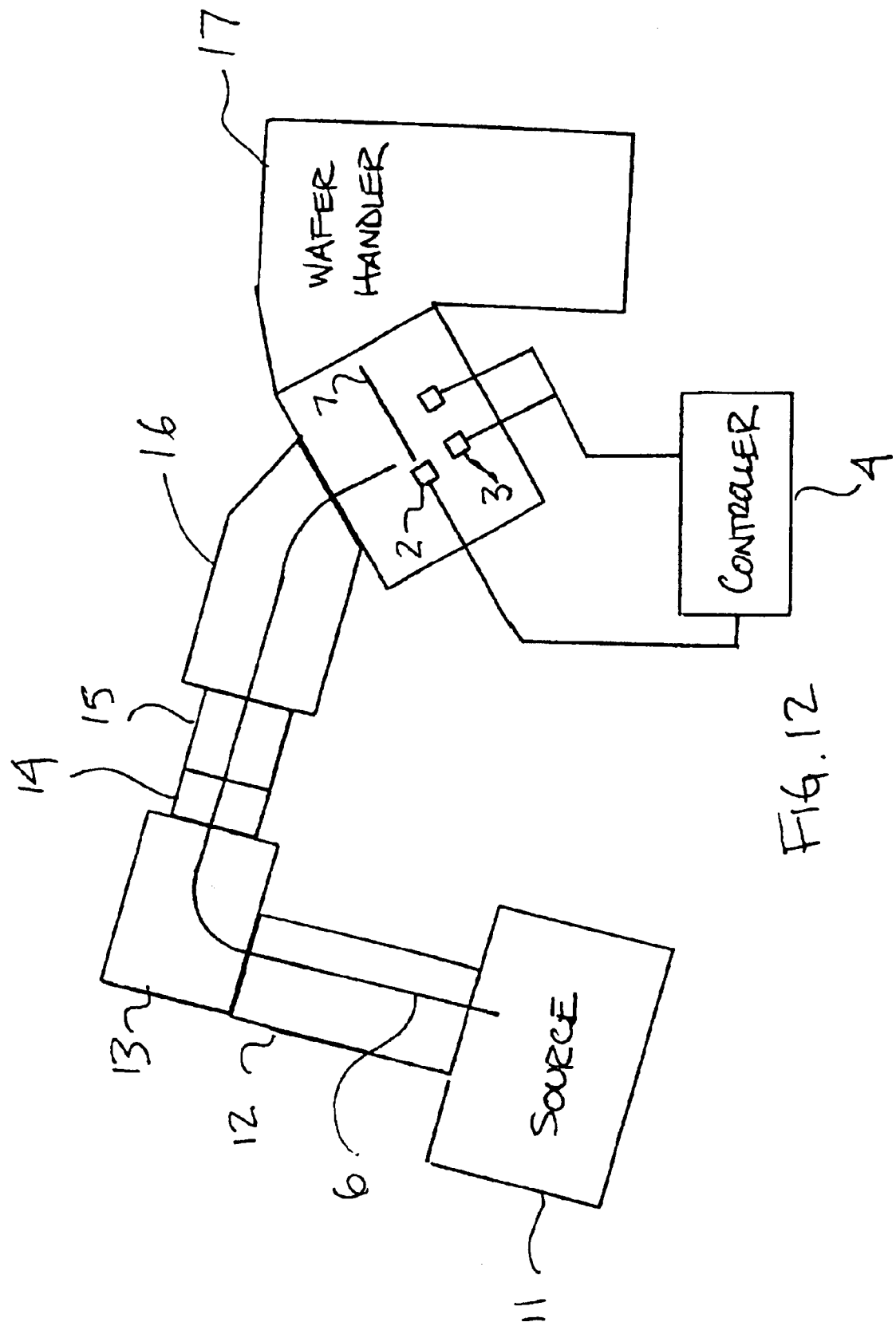
FIG. 12 is a schematic block diagram of an ion implantation system capable of determining a measure of a beam's direction and parallelism in accordance with the invention.

FIG. 12 is a schematic block diagram of an ion implantation system suitable for incorporation of the invention. An ion source 11 generates ions and supplies an ion beam 6. As known in the art, ion source 11 may include an ion chamber and a gas box containing a gas to be ionized. The gas is supplied to the ion chamber where it is ionized. The ions thus formed are extracted from the ion chamber to form the ion beam 6. The ion beam 6 may have an elongated cross section and be ribbon-shaped, with a long dimension of the beam 6 cross section preferably having a horizontal orientation, or the ion beam 6 may have a circular cross section. An extraction power supply and extraction electrode 12 accelerate ions from the ion source 11. The extraction power supply may be adjustable, for example, from about 0.2 to 80 kV. Thus, ions from ion source 11 may be accelerated to energies of about 0.2 to 80 keV by the extraction electrode 12. The construction and operation of ion sources are well known to those skilled in the art.

The ion beam 6 passes through a suppression electrode and a ground electrode (not shown) to a mass analyzer 13. The mass analyzer 13 includes a resolving magnet that deflects ions in the ion beam 6 such that ions of a desired ion species pass through a resolving aperture 14 and undesired ion species do not pass through resolving aperture 14. In a preferred embodiment, resolving magnet deflects ions of the desired species by 90°.

Ions of the desired ion species pass through the resolving aperture 14 to an optional scanner 15 positioned downstream of mass analyzer 13. The scanner 15 may include scanning electrodes as well as other electrodes (not shown) for controlling the beam 6. Ions in the ion beam 6 are scanned and then pass through an angle corrector magnet 16. The angle corrector magnet 16 deflects ions of the desired ion species and converts the ion beam from a diverging ion beam to an ion beam 6 having substantially parallel ion trajectories. In a preferred embodiment, angle corrector magnet 16 deflects ions of the desired ion species within a range of 45–70°.

An end station 17 supports one or more semiconductor wafers in the path of ribbon ion beam 6 such that ions of the desired species are implanted into the semiconductor wafers. The end station 17 may include a cooled electrostatic platen and a scanner for moving wafers perpendicular to the long dimension of the cross section or scan direction of the ion beam 6, so as to distribute ions over the wafer surface.

The ion implantation system may include additional components known to those skilled in the art. For example, end station 17 typically includes automated wafer handling equipment for introducing wafers into the ion implantation system and for removing wafers after implantation. End station 17 may also include a dose measuring system, an electron flood gun and other known components. It will be understood that the entire path traversed by the ion beam is evacuated during ion implantation. Additional details of the ion implantation system are not provided here since they are well known in the art and not necessarily important to the invention.

The ion implantation system in this example includes a beam modifier 2 positioned in the end station 17 that is a Faraday profiler used to determine the uniformity of the beam 6. That is, a controller 4 and associated drive mechanism moves the beam modifier 2 in a direction transverse to the beam 6 (and preferably along the workpiece plane 7) so that a measure of uniformity of the beam 6 can be obtained. Simultaneously, the beam modifier 2 creates an adjusted intensity profile and two or more detectors 3 detect an intensity profile as described above in connection with FIGS. 2 and 3. (Of course, a single fixed or movable detector 3 could be used instead of two or more detectors.) Accordingly, the controller 4 can determine a measure of uniformity of the beam 6 as well as a direction of the beam 6 and/or a parallelism of the beam. If desired, the controller 4 can adjust the operation of various aspects of the ion implantation system to make desired changes in the beam 6 characteristics. For example, the operation of the angle corrector magnet 16 may be adjusted to produce a more collimated beam 6. Although the beam modifier 2 is preferably moved along a workpiece plane 7, the beam modifier 2 and the detectors 3 may be positioned at any point along the beam path. However, the beam modifier 2 and the detectors 3 are preferably positioned downstream of the angle corrector magnet 16.

Figure 13:
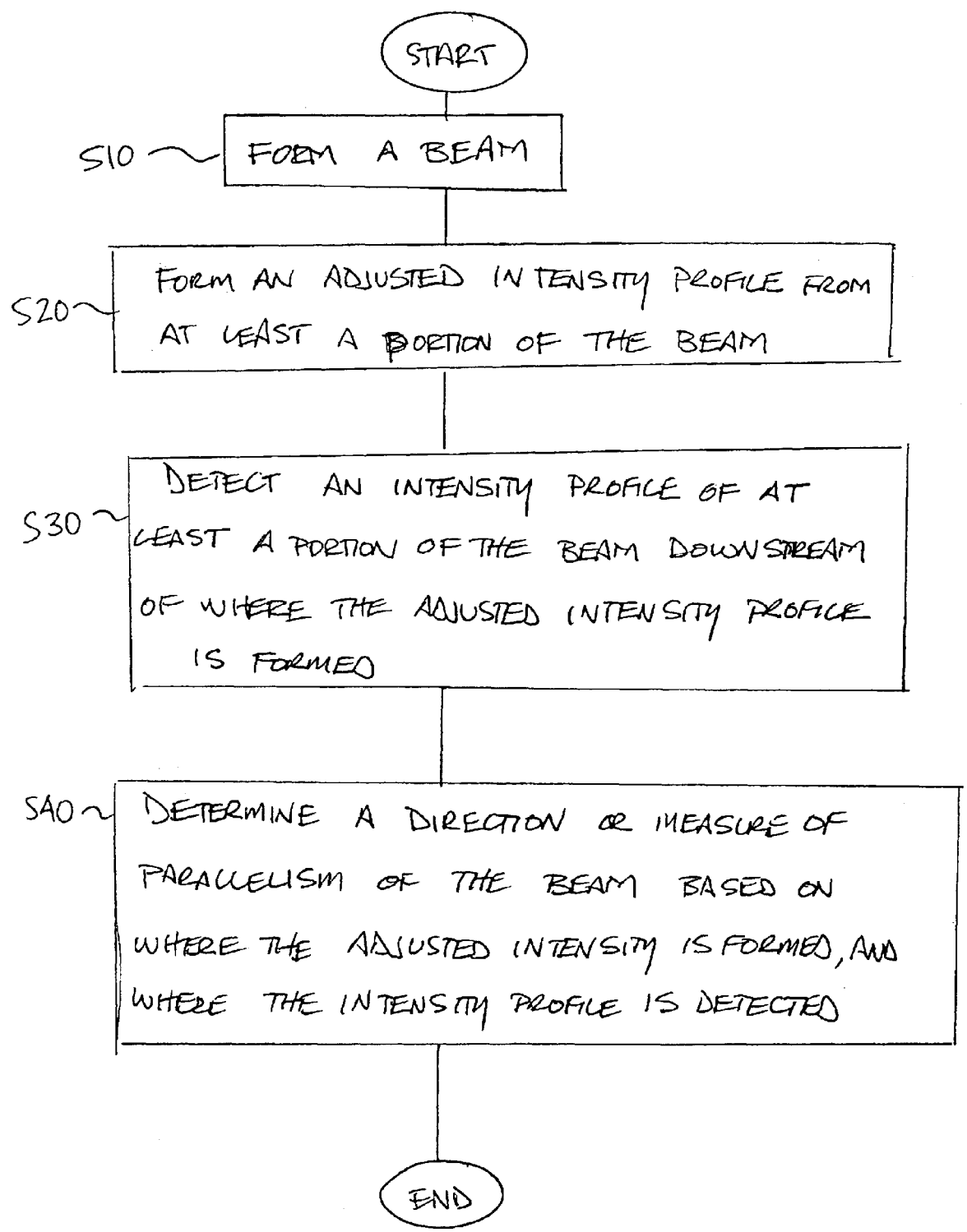
FIG. 13 is a flowchart of steps in a method for determining a direction and/or parallelism of a beam.

FIG. 13 is a flow chart of steps of a method for determining a direction or parallelism of a beam. In step S10, a beam is formed. The beam can be any type of any desired beam, including an uncharged and charged particle beam, electromagnetic radiation beam, etc.

In step S20, an adjusted intensity profile is formed from at least a portion of the beam. The adjusted intensity profile can be any change in the beam's original intensity and can be formed in any desired way. For example, a mask or other object may be used to block a portion of the beam and allow another portion of the beam to be transmitted. The adjusted intensity profile can be formed by active elements, such as a beam detector (e.g., a Faraday profiler used in an ion implantation system used to determine uniformity of an ion beam) or an active matrix of liquid crystal cells, movable plates, irises or optical stops, etc. The device or devices used to form the adjusted intensity profile can be movable or fixed in place.

In step S30, an intensity profile of at least a portion of the beam is detected downstream of where the adjusted intensity profile is formed. The detected intensity profile can correspond exactly to the adjusted intensity profile, or can have other intensity features. The intensity profile can be detected by one or more detectors and the detectors can be any type of detector, typically depending upon the type of beam being used. For example, if a light beam is being used, the detector or detectors can be CCD imaging devices, video cameras, photographic film, or any other photosensitive device. If the beam is an ion beam, the detectors can be Faraday cups or other similar devices used to detect ions in the beam. The detector or detectors can include one or more discrete detection elements or a single area detector, and can detect an area of a beam that is larger than, the same size as, or smaller than the device used to form the adjusted intensity profile.

In step S40, a direction or parallelism of the beam is determined based on the relative positions of adjusted intensity profile formation and intensity profile detection. As discussed above, the relative positions of the adjusted intensity profile and the detected intensity profile can be used to determine a beam's direction or degree of parallelism. For example, the relative displacement of a position where the adjusted intensity is formed and where the intensity profile is detected with respect to a reference direction or directions can be used to determine the beam's direction or parallelism with respect to the reference direction or directions. A portion of the beam may be blocked at a first position and the adjusted intensity profile (i.e., the shadow created) can be detected downstream of the first position. The relative positions of where the shadow is created and where the shadow is detected can be used to determine the direction of the beam and/or the parallelism of the beam as discussed above. As one example, a shadow is created at position X1 on the X axis, and the shadow is detected at position X2 on the X axis at a perpendicular distance H along the Y axis downstream of where the shadow was created. A direction or parallelism of the beam may be determined based on the distances X1–X2 and H, e.g., an angle $\theta$ of the beam relative to the Y axis where the shadow was created may be determined to be equal to $\tan(X1-X2)/H$.

While the invention has been described in conjunction with specific embodiments thereof, it is evident that many alternatives, modifications and variations will be apparent to those skilled in the art. For example, various combinations of moving beam modifiers and fixed detectors, fixed beam modifiers and moving detectors, fixed beam modifiers and detectors, and moving beam modifiers and detectors can be used. At a minimum, a single beam modifier and a single detector are required to measure a beam's direction or parallelism as discussed above. Accordingly, preferred embodiments of the invention as set forth herein are intended to be illustrative, not limiting. Various changes may be made without departing from the invention.

What is claimed is:

1. A method for determining a direction or parallelism of a beam, comprising:
    forming a beam which is implanted into a work piece;
    forming an adjusted intensity profile from at least a portion of the beam at a first position;
    detecting at least one variation in intensity in the adjusted intensity profile independent from said step of creating the adjusted intensity profile downstream of the first position; and
    determining a direction or parallelism of the beam while implanting into said work piece relative to a reference direction in response to detecting a distance in at least one dimension between a position where the at least one variation in intensity is detected and the first position where the adjusted intensity profile is formed.

2. The method of claim 1, wherein the step of forming a beam comprises forming a charged particle beam.

3. The method of claim 1, wherein the step of forming a beam comprises forming an ion beam for implanting dopant materials into a semiconductor material.

4. The method of claim 1, wherein the step of forming an adjusted intensity profile comprises blocking a portion of the beam.

5. The method of claim 1, wherein the step of forming an adjusted intensity profile comprises scanning a detection device in a direction transverse to the beam.

6. The method of claim 1, wherein the step of forming an adjusted intensity profile comprises:
    positioning a detection device in the beam; and
    determining a measure of intensity uniformity of the beam.

7. The method of claim 1, wherein the step of detecting at least one variation in intensity comprises:
    providing at least one detector downstream of the first position; and
    detecting a change in beam intensity downstream of the first position with the detector.

8. The method of claim 1, wherein the step of detecting at least one variation in intensity comprises:
    moving a detector in a direction transverse to the beam direction; and
    detecting a change in beam intensity that corresponds to the adjusted intensity profile.

9. The method of claim 1, wherein the step of determining a direction or parallelism comprises:
    identifying a first position where an adjusted intensity profile that caused a detected minimum intensity was created;
    identifying a second position where the minimum intensity is detected; and
    determining a direction or parallelism of the beam based on the first and second positions relative to the reference direction.

10. The method of claim 1, further comprising:
    forming a second adjusted intensity profile from at least another portion of the beam at a second position;
    detecting a second variation in intensity of at least another portion of the beam downstream of the second position;
    determining a direction or parallelism of the beam based on the positions of the detected intensity profiles relative to the positions of the first and second adjusted intensity profiles.

11. A method for determining a direction or parallelism of an ion beam, comprising:
    forming an ion beam which is implanted into a work piece;
    blocking a portion of the beam with a beam modifier;
    identifying a position where a shadow is formed independent from and downstream of the beam modifier; and
    determining a direction or parallelism of the ion beam while implanting into said work piece in response to detecting a distance between the position of the shadow and the position of the beam modifier.

12. The method of claim 11, wherein the step of blocking a portion of the beam comprises scanning a beam modifier in a direction transverse to the beam; and
    determining a measure of uniformity of the beam.

13. The method of claim 11, wherein the step of identifying a position comprises:
    detecting an intensity profile of the beam; and
    determining a position of the beam modifier that corresponds to a detected minimum intensity.

14. An apparatus for determining a direction or parallelism of a beam, comprising:
    means for forming a beam which is implanted into a work piece;
    means for forming an adjusted intensity profile from at least a portion of the beam at a first position;
    means for detecting an intensity profile of at least a portion of the beam independent from said means for forming the adjusted intensity profile downstream of the first position at a second position that is variable in distance from the first position in accordance with changes in direction or parallelism of the beam relative to a reference direction; and means for determining a direction or parallelism of the beam relative to a reference direction while implanting into said work piece in response to detecting a distance between a position of the detected intensity profile and a position where the adjusted intensity profile is formed.

15. An apparatus for determining a direction or parallelism of a charged particle beam, comprising:

at least one detector that detects an intensity profile of at least a portion of the charge particle beam which is implanted into a work piece;

a beam modifier that alters an intensity profile of at least a portion of the charged particle beam independent from the at least one detector upstream of the at least one detector; and a controller that determines a direction or parallelism of the charge particle beam relative to a reference direction while implanting into said work piece in response to a detected distance in at least one dimension between a position where the intensity profile is detected by the at least one detector and a position where the beam modifier created the detected intensity profile.

16. The apparatus of claim 15, wherein the controller determines a direction or parallelism based on the positions of at least one detector and the beam modifier relative to a reference direction at a point of minimum detected beam intensity.

17. The apparatus of claim 15, wherein the beam modifier includes a drive system that moves the beam modifier transverse to a path of the charged particle beam.

18. The apparatus of claim 15, wherein the beam modifier outputs a signal that is used to determine a measure of uniformity of the charged particle beam.

19. The apparatus of claim 18, wherein two detectors detect an intensity profile of two respective portions of the charged particle beam, and the beam modifier is a Faraday detector moved in a direction transverse to the charged particle beam.

20. The apparatus of claim 19, wherein the beam modifier is moved in a direction transverse to the beam direction along a workpiece plane.

21. An ion beam implantation apparatus comprising:

a charged particle beam generator that generates a charged particle beam;

at least one detector that detects an intensity profile of at least a portion of the charged particle beam which is implanted into a workpiece;

a beam modifier that alters an intensity profile of at least a portion of the charged particle beam independent from the at least one upstream of the at least one detector; and a controller that determines a direction or parallelism of the charged particle beam relative to a reference direction while implanting into said workpiece in response to a detected distance in at least one dimension between a position where the intensity profile is detected by the at least one detector and a position where the beam modifier created the detected intensity profile.

22. The apparatus of claim 21, wherein the charged particle beam generator scans the charged particle beam in a direction along at least a portion of a workpiece plane.

23. An apparatus for determining a direction or parallelism of a charged particle beam, comprising:

at least one detector that detects an intensity profile of at least a portion of the charge particle beam which is implanted into a work piece;

a beam modifier that alters an intensity profile of at least a portion of the charged particle beam upstream of the at least one detector; and a controller that determines a direction or parallelism of the charge particle beam relative to a reference direction while implanting into said work piece in response to a detected distance in at least one dimension between a position where the intensity profile is detected by the at least one detector and a position where the beam modifier created the detected intensity profile;

wherein the at least one detector includes at least three detectors and the controller determines a direction or parallelism of the charged particle beam in three dimensions relative to the reference direction.

24. The apparatus of claim 15, wherein the direction or parallelism is determined based on detections of intensity profiles at a plurality of different positions.

25. A method for determining a direction or parallelism of a beam, comprising:

forming a beam which is implanted into a work piece;

at a first beamline location, modifying the beam to produce a modified intensity profile having a spatial intensity variation;

at a second beamline location downstream of the first beamline location, detecting the spatial intensity variation in the modified intensity profile independent from the steps of modifying the beam; and determining a beam direction or parallelism while implanting into said work piece based on relative positions of the spatial intensity variation in the modified intensity profile at the first and second beamline locations.

* * * * *